United States Patent [19]

Naylor et al.

[11] Patent Number: 5,235,333
[45] Date of Patent: Aug. 10, 1993

[54] HYSTERESIS-INSENSITIVE SINGLE-COMPARATOR SUCCESSIVE APPROXIMATION ANALOG-TO-DIGITAL CONVERTER

[75] Inventors: Jimmy R. Naylor; Bernd M. Rundel, both of Tucson, Ariz.

[73] Assignee: Burr-Brown Corporation, Tucson, Ariz.

[21] Appl. No.: 846,670

[22] Filed: Mar. 5, 1992

[51] Int. Cl.$^5$ .......................... H03M 1/06; H03M 1/36
[52] U.S. Cl. ...................................... 341/118; 341/172
[58] Field of Search ............... 341/118, 119, 120, 136, 341/162, 163, 172

[56] References Cited

U.S. PATENT DOCUMENTS

| | | | |
|---|---|---|---|
| 4,138,666 | 2/1979 | Eichelburger et al. | 341/118 |
| 4,348,658 | 9/1982 | Corter | 341/172 X |
| 4,620,179 | 10/1986 | Cooper et al. | 341/156 |
| 4,940,981 | 7/1990 | Naylor et al. | 341/161 |
| 4,947,169 | 8/1990 | Smith et al. | 341/121 |
| 4,975,700 | 12/1990 | Tan et al. | 341/118 |
| 5,006,853 | 4/1991 | Kiriaki et al. | 341/156 |

Primary Examiner—Howard L. Williams
Attorney, Agent, or Firm—Cahill, Sutton & Thomas

[57] ABSTRACT

A circuit for preventing analog-to-digital conversion errors due to MOS threshold shifts produced in a comparator during successive approximation testing of MSB and LSB groups of binarily weighted bit capacitors includes a first amplifier that amplifies voltage changes produced on a charge distribution conductor connected to the bit capacitors during successive approximation testing of the bit capacitors of the MSB group. The output of the first amplifier subjects a MOSFET in an input stage of the comparator to sufficiently large gate-to-source voltages to produce an MOS threshold shift in the MOSFET. During successive approximation testing of bit capacitors of the LSB group, a second amplifier amplifies signals representative of voltage changes produced on the charge distribution conductor and applies the amplified signals to the same MOSFET. The second amplifier has a sufficiently large gain that the earlier induced MOS threshold shift, when referred back to an input of the amplifier by dividing the MOS threshold shift by the gain, is small enough compared to the voltage changes produced on the charge distribution conductor during the successive approximation testing of the bit capacitors of the LSB group to avoid conversion errors.

16 Claims, 3 Drawing Sheets

5,235,333

HYSTERESIS-INSENSITIVE SINGLE-COMPARATOR SUCCESSIVE APPROXIMATION ANALOG-TO-DIGITAL CONVERTER

BACKGROUND OF THE INVENTION

The invention relates a single-comparator technique for avoiding errors caused by MOS threshold voltage hysteresis produced in the comparator during successive approximation testing of a most significant group of bit capacitors of a CDAC capacitor array, and preventing such hysteresis from producing errors in subsequent successive approximation testing of a least significant group of bit capacitors of the CDAC capacitor array.

It is well known that successive approximation analog-to-digital converters of the type including a CDAC (capacitor digital-to-analog converter) using switched capacitor arrays of binarily weighted capacitors can be economically implemented using CMOS technology. Commonly assigned Pat. Nos. 4,940,981 (Naylor et al.) and 4,947,169 (Smith et al.) are indicative of the state-of-the-art. It also is known that during successive approximation testing of the most significant bits the output voltage changes produced by the CDAC capacitor array are sufficiently large (typically as large as one or two volts) to cause a momentary shift (sometimes referred to as "hysteresis") in the MOS threshold voltage of the input differential MOSFET stage of the comparator. Once the differential input voltage to the gate electrodes of the differential MOSFET input stage returns to a balance condition (i.e., zero volts), the shifted threshold voltage of the MOSFETs will require from a few microseconds to tens of milliseconds to "relax". The lengthy duration of this MOS threshold voltage shift greatly exceeds the conversion time of the analog-to-digital converter, and consequently can produce errors in the conversion process, especially when making critical bit decisions within a few microvolts of a balanced condition at the gate electrodes of the MOSFETs of the differential input stage.

Pat. No. 5,006,853, entitled "HYSTERESIS-INSENSITIVE ANALOG-TO-DIGITAL CONVERTER SYSTEM USING A COARSE COMPARATOR AND A FINE COMPARATOR", hereinafter referred to as the Kiriaki reference, discloses a system in which a "coarse comparator" and a "fine comparator" are utilized. The coarse comparator is used to test the most significant bit capacitors of a CDAC capacitor array, and the fine comparator is used to test a group of least significant bit capacitors thereof. FIG. 1 of the present application discloses the Kiriaki et al. technique. The Kiriaki reference describes the MOS threshold voltage hysteresis that is produced in a "coarse" MOSFET comparator 36A (with capacitor input isolation switch 7A closed) during successive approximation testing of the most significant group of "bit capacitors". The Kiriaki reference solves this problem by isolating "fine comparator" 36B in FIG. 1 hereof from conductor 12 by opening switch 7B during testing of the n most significant bit capacitors of the CDAC capacitor array 13A. Since capacitor input isolation switch 7A is closed, and since the voltage changes on CDAC array output conductor 12 during testing of the m most significant bit capacitors are large enough to induce MOS threshold shifts into the input MOSFETs of coarse comparator 36A, the input MOSFETs of coarse capacitor 36A undergo an MOS threshold voltage shift, potentially causing an erroneous decision while testing the n most significant bits. However, the input MOSFETs of fine comparator 26 are isolated by open switch 7B from such voltage swings of conductor 12 until all of the n most significant bit capacitors have been tested, so the input MOSFETs of fine comparator 36B do not see the large voltage swings and consequently no MOS threshold shift is caused therein. Then, when the m least significant bit group of CDAC capacitor bits are tested, switch 7A is open and switch 7B is closed. For the m least significant bit capacitors, the voltage on conductor 12 does not swing through a large enough range to produce a shift in the MOS threshold voltage of the input MOSFETs of fine comparator 36. Errors in the conversion of the least significant bits due to MOS threshold voltage shift therefore are avoided. Conventional digital error correction techniques are used to correct any erroneous bit decisions that may have been made while testing the n most significant bits.

The technique disclosed in the Kiriaki reference requires two comparators. This results in excessive power dissipation, excessive circuit complexity and excessive consumption of semiconductor chip surface area. The resistances of the series switches 7A and 7B increase the thermal noise of the circuit. The large MOSFETs required to implement switches 7A and 7B also may result in charge injection problems. The requirement of providing two separate comparators results in substantially increased semiconductor chip area and increased power consumption over prior comparators used in successive approximation analog-to-digital converters.

There is a need for improved comparator circuitry and an improved technique in a CMOS successive approximation digital-to-analog converter to overcome the foregoing difficulties, making it more practical to produce a CMOS successive approximation digital-to-analog converter with accuracy that exceeds 11 to 12 bits.

SUMMARY OF THE INVENTION

It is an object of the invention to provide a single-comparator circuit that avoids conversion errors due to a shift produced in the MOS threshold voltage of a comparator during testing of a most significant group of bit capacitors in a CDAC capacitor array of a successive approximation analog-to-digital converter.

It is another object of the invention to avoid thermal noise caused by the series switches used to isolate the coarse and fine comparators in the Kiriaki et al. reference.

It is another object of the invention to avoid charge injection problems that may be caused by the series switches used to isolate the coarse and fine comparators in the Kiriaki et al. reference.

It is another object of the invention to reduce the semiconductor chip area required in implementing the coarse and fine comparators of the Kiriaki et al. reference.

It is another object of the invention to reduce the power consumption required in implementing the coarse and fine comparators of the Kiriaki et al. reference.

Briefly described, and in accordance with one embodiment thereof, the invention provides, in an MOS analog-to-digital converter, successive approximation circuitry that includes an array of binarily weighted capacitors, including a most significant group and a least significant group each coupled to a charge distribution conductor. At least one of the binarily weighted capacitors is coupled by a sampling switch to receive an analog input voltage, the other binarily weighted capacitors being switchable between first and second reference voltages in response to test bit signals produced by a successive approximation circuit. A first amplifier circuit includes a first differential MOSFET input circuit and first and second inputs coupled thereto and to the charge distribution conductor and a reference signal conductor, respectively. A first current source is selectively coupled by a first switch to a common source conductor of the first differential MOSFET input circuit during the testing of capacitors of the most significant group in response to a first test bit signal. A second amplifier circuit includes a second differential MOSFET input circuit and first and second inputs coupled thereto and to the charge distribution conductor and a reference signal conductor, respectively. A second current source is selectively coupled by a second switch to a common source conductor of the second differential MOSFET input circuit during the testing of capacitors of the least significant group in response to a second test bit signal. A multiplexed input differential amplifier includes a third differential MOSFET input circuit and first and second inputs coupled thereto and to first and second outputs of the first amplifier circuit, respectively. The multiplexed input differential amplifier also includes a fourth differential MOSFET input circuit and third and fourth inputs coupled thereto and to first and second outputs of the second amplifier circuit, respectively. A third current source and a third switch selectively couples the third current source to a common source conductor of the third differential input circuit during the testing of capacitors of the most significant group. A fourth switch selectively couples the third current source to a common source conductor of the fourth differential MOSFET input circuit during the testing of capacitors of the least significant group. A comparator includes a fifth differential MOSFET input circuit having inputs coupled by the multiplexed input differential amplifier to first and second outputs, respectively, of each of the first and second amplifier circuits. The comparator includes an output circuit coupled to the successive approximation circuit to control the logic levels of the test bit signals.

DETAILED DESCRIPTION OF THE PREFERRED EMBODIMENTS

Figure 2:
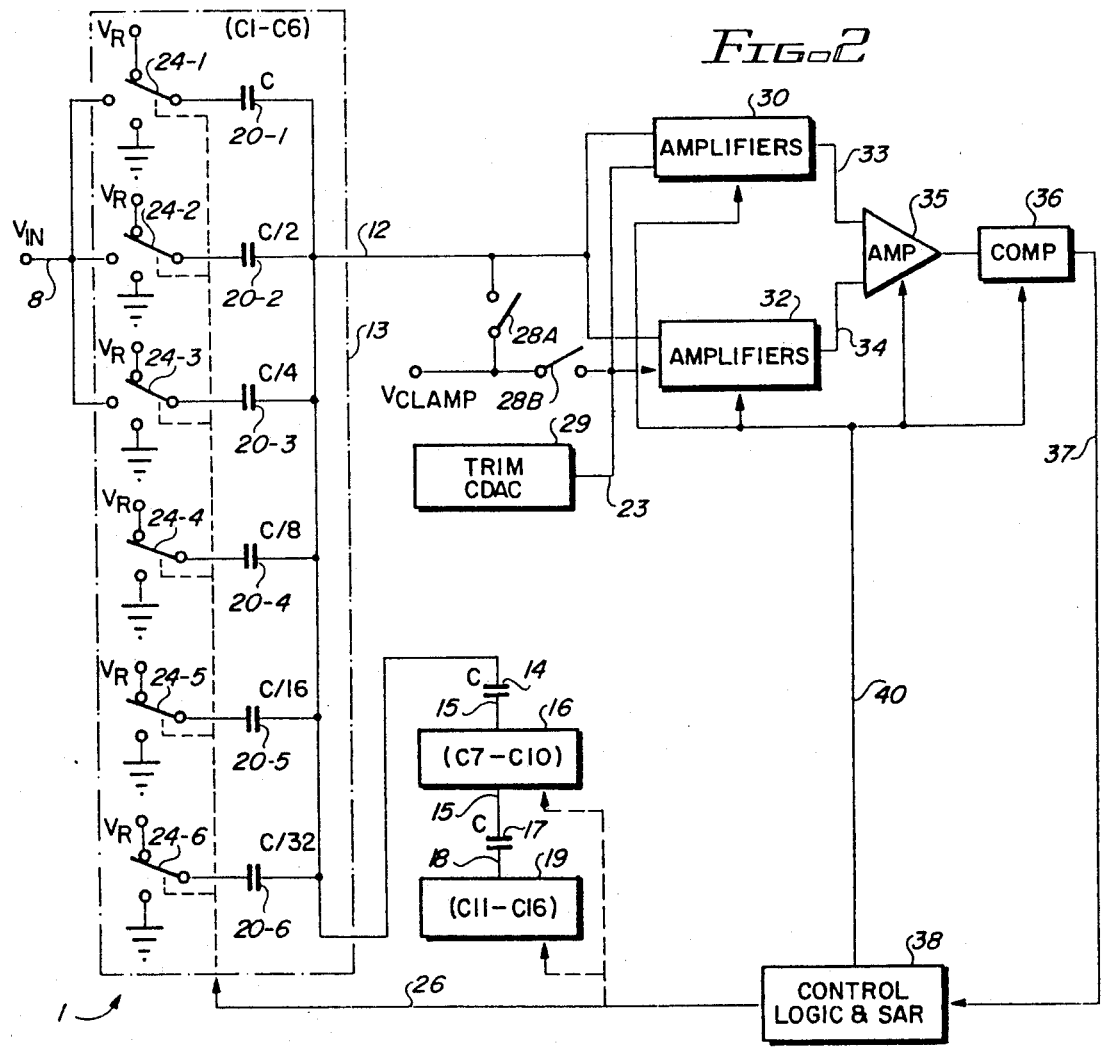
FIG. 2 is a schematic diagram of the present invention.

Referring to FIG. 2, an analog input voltage $V_{IN}$ is applied by conductor 8 to one terminal of each of single pole, triple throw switches 24-1, 24-2, and 24-3 (which can be easily implemented by MOS transistors). Single pole, triple throw switches 24-1 ... 24-3 and single pole, double throw switches 24-4 ... 24-6 each have a pole terminal connected to a first terminal of a corresponding one of binarily weighted capacitors 20-1 ... 20-6, which are included in CDAC subarray 13. The opposite terminal of each of capacitors 20-1 ... 20-6 is connected to charge distribution conductor 12. Each of switches 24-1 ... 24-6 also has a terminal connected to reference voltage $V_R$ and another terminal connected to ground. During sampling of $V_{IN}$, switches 24-1 ... 24-3, which are the three most significant bit capacitors of analog-to-digital converter 1, are connected to conductor 8. During successive approximation testing of the binarily weighted bit capacitors, switches 24-1 ... 24-6 and similar switches in CDAC subarrays 16 and 19 are variously connected to $V_R$ or ground, as subsequently explained.

Charge distribution conductor 12 also is connected to one terminal of a scaling capacitor 14, the opposite terminal of which is connected to a second charge distribution conductor 15 that extends through second CDAC capacitor subarray 16. The portion of charge distribution conductor 15 passing beyond CDAC subarray 16 is connected to one terminal of a second scaling capacitor 17, the opposite conductor of which is connected to charge distribution conductor 18. Charge distribution conductor 18 extends through a third CDAC subarray 19. CDAC subarray 16 contains bit capacitors for the four next most significant bits of analog-to-digital converter 1, and CDAC subarray 19 contains bit capacitors corresponding to the six least significant bits of analog-to-digital converter 1. The most significant bit capacitor in each of CDAC capacitor subarrays 13, 16, and 19 has a capacitance C, the next most significant bit capacitor has a value C/2, etc. The use of scaling capacitors 14 and 17 avoids the need to manufacture extremely small capacitors for the least significant bits of analog-to-digital converter 1.

In each of CDAC subarrays 13, 16, and 19, one terminal of each capacitor is connected to the appropriate charge distribution conductor 12, 15, or 18. The opposite terminal of each capacitor is connected by a "capacitor switch" that can be selectively converted to either ground or $V_R$. All of the capacitor switches are controlled by signals on a bus 26 produced by SAR (successive approximation register) circuit 38.

Charge distribution conductor 12 is connected to one terminal of a switch 28A, another terminal of which is connected to the reference voltage $V_{CLAMP}$. Charge distribution conductor 12 also is connected to the inputs of two amplifier circuits 30 and 32. The output of amplifier circuit 30 is connected by a pair of conductors 33 to one pair of inputs of a multiplexed input amplifier 35. The output of amplifier circuit 32 is connected by a pair of conductors 34 to another pair of inputs of multiplexed input amplifier 35. Multiplexed input amplifier 35 is of a type such as the OPA675 wide band switched-input operational amplifier marketed by the present assignee. The outputs of amplifier 35 are connected to the inputs of comparator 36, the output of which is connected by conductor 37 to an input of control logic and SAR circuit 38. The control logic of SAR circuit 38 produces signals on bus 40 which is connected to control the inputs of amplifiers 30 and 32 and amplifier 35 and a latch control input of comparator 36.

Figure 3:
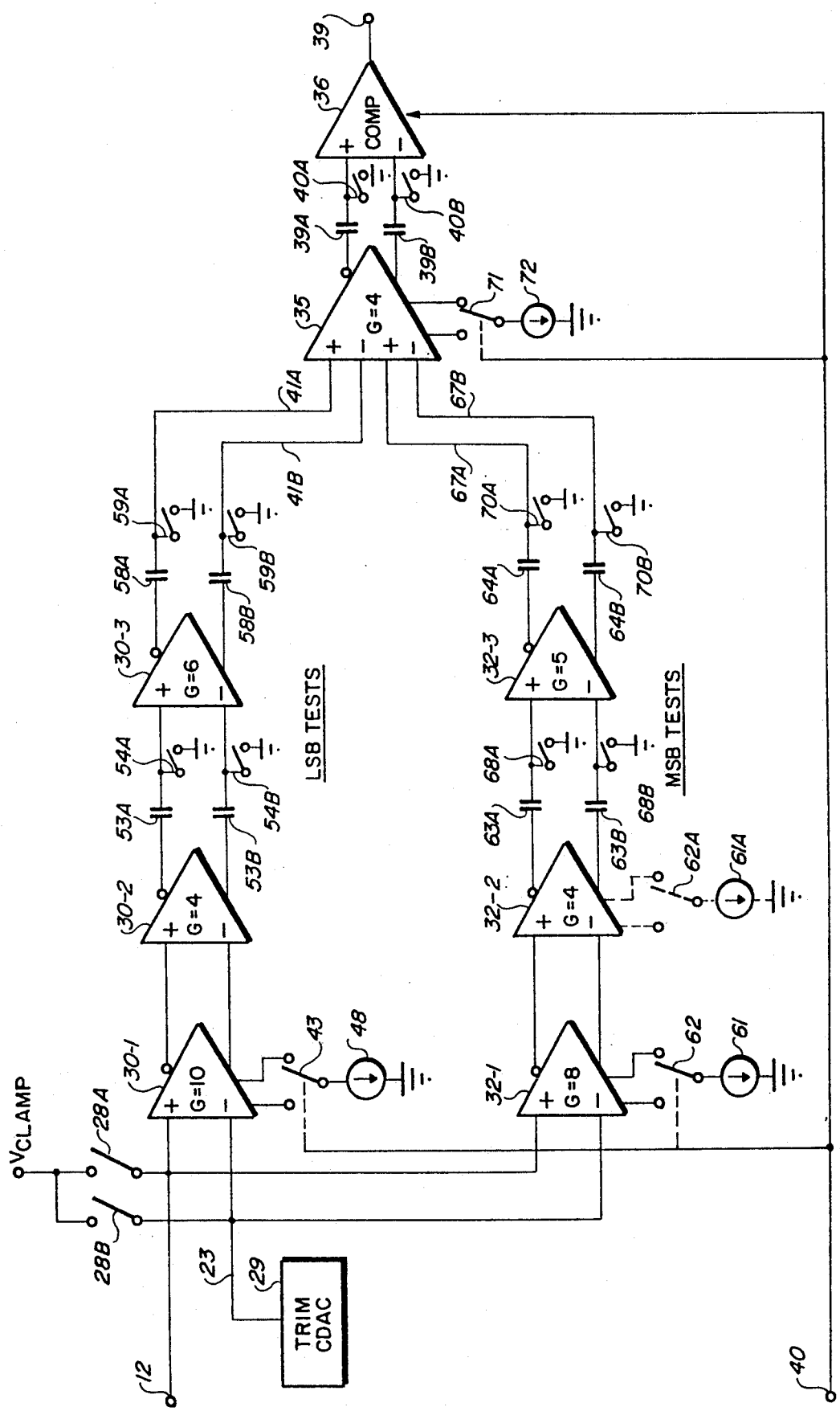
FIG. 3 is a block diagram of the comparator and amplifier circuitry of FIG. 2.

FIG. 3 more accurately indicates the differential structure of the various amplifying circuits of FIG. 2. Amplifier circuit 30 of FIG. 2 includes differential amplifiers 30-1, 30-2 and 30-3 of FIG. 3, and amplifier circuit 32 includes differential amplifiers 32-1, 32-2 and 32-3. The signal on charge distribution conductor 12 is applied to the non-inverting input of amplifier 30-1. The inverting input of amplifier 30-1 is connected by conductor 23 to the output of a trim CDAC 29. (Trim CDACs are well known, and are disclosed in commonly assigned Pat. Nos. 4,940,981 and 4,947,169.) Charge distribution conductor 12 and reference conductor 23 are selectively coupled to $V_{CLAMP}$ by switches 28A and 28B, respectively. The inverting output of amplifier 30-1 is connected to the non-inverting input of amplifier stage 30-2. (As used herein, the term "inverting" output means inverting with respect to the non-inverting input of the differential amplifier, and "non-inverting" output means non-inverting with respect to the non-inverting input of the differential amplifier.) The non-inverting output of amplifier 0-1 is connected to the inverting input of amplifier 30-2. The inverting output of amplifier 30-2 is connected to one terminal of autozeroing capacitor 53A, the other terminal of which is selectively coupled by autozeroing switch 54A to a reference voltage and to the non-inverting input of amplifier 30-3. The non-inverting output of amplifier 30-2 is connected to one terminal of autozeroing capacitor 53B, the other terminal of which is connected to the inverting input of amplifier 30-3 and which is selectively coupled by autozeroing switch 54B to that reference voltage.

The inverting output of amplifier 30-3 is connected to one terminal of autozeroing capacitor 58A, the other terminal of which is connected to autozeroing switch 59A and one of the non-inverting inputs of multiplexed input amplifier 35. The non-inverting output of amplifier 30-3 is connected to one terminal of autozeroing capacitor 58B, the other terminal of which is connected to autozeroing switch 59B and to one of the inverting inputs of multiplexed input amplifier 35. The inverting and non-inverting outputs of multiplexed input amplifier 35 are coupled to the non-inverting and inverting inputs, respectively, of comparator 36 through autozeroing capacitors 39A and 39B. Autozeroing switches 40A and 40B are connected to the right hand terminals of autozeroing capacitors 39A and 39B, respectively.

Charge distribution conductor 12 and the output of trim CDAC 29 are connected to the non-inverting and inverting inputs, respectively, of amplifier 32-1. Its non-inverting and inverting outputs are connected to the inverting and non-inverting inputs, respectively, of amplifier 32-2. The inverting and non-inverting outputs of differential amplifier 32-2 are coupled by autozeroing capacitors 63A and 63B to the non-inverting and inverting inputs of amplifier 32-3, respectively, and also to suitable autozeroing switches 68A and 68B, respectively. The inverting and non-inverting outputs of amplifier 32-3 are coupled by autozeroing capacitors 64A and 64B to the remaining non-inverting and inverting inputs, respectively, of multiplexed input amplifier 35 and also to autozeroing switches 70A and 70B, respectively.

Figure 4:
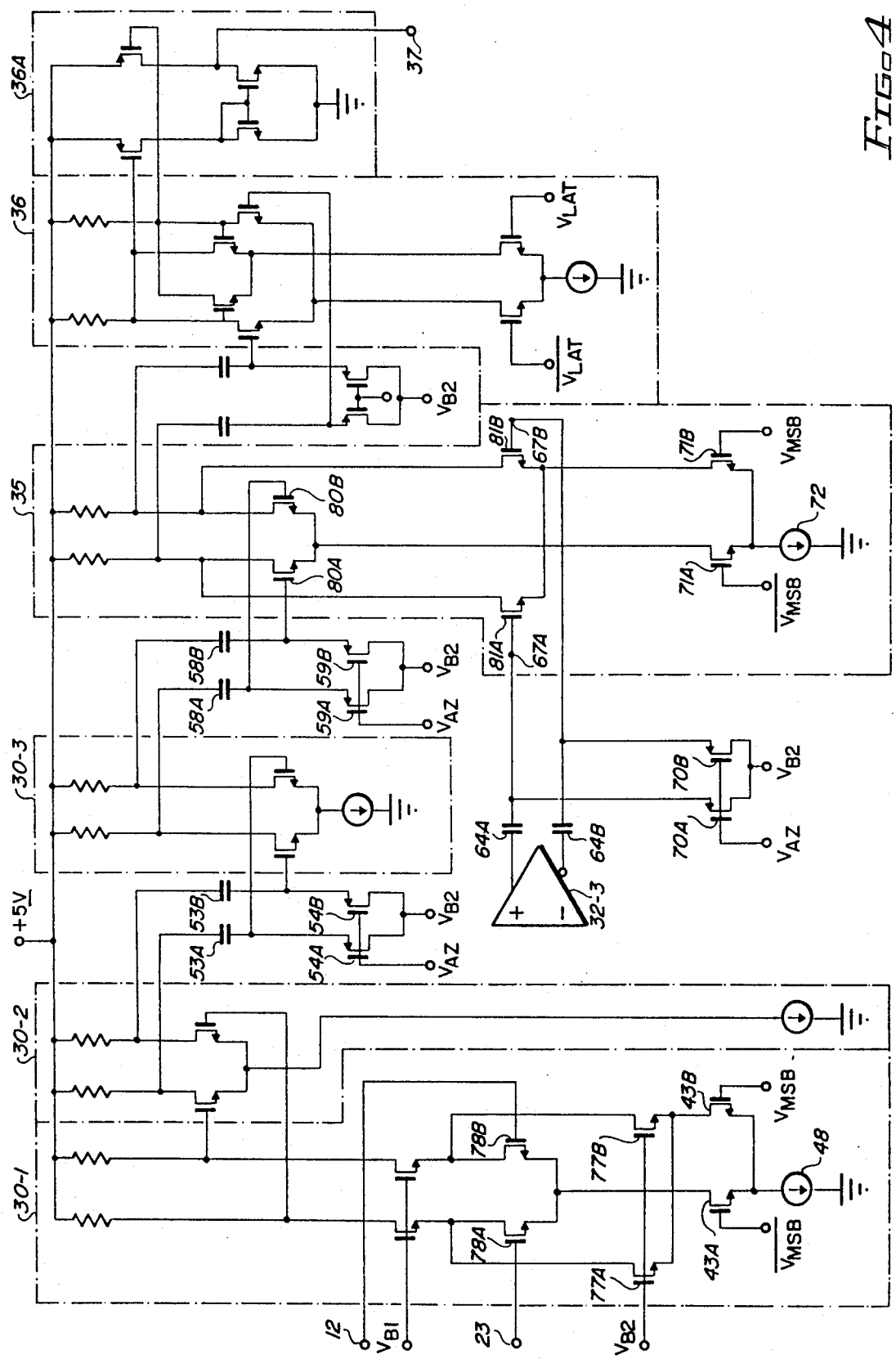
FIGS. 4 is a detailed circuit schematic diagram of the circuitry of FIG. 3.

In accordance with the present invention, switch 43 selectively connects a constant current source 48 to either the common source electrodes of MOSFETs 78A and 78B (FIG. 4) of the differential input stage of amplifier 30-1 or a pair of common source MOSFETs 77A and 77B connected as shown in FIG. 4 to bias the inputs of amplifier 30-2. Similarly, switch 62 either connects constant current source 61 to common source electrodes of a MOSFET differential input stage of amplifier 32-1 to or to a pair of common source MOSFETs connected to bias the inputs of amplifier 32-2. Switch 71 selectively connects the common source electrodes of one of the two MOSFET differential input stages of multiplexed input amplifier 35 to constant current source 72. Switch control bus 40, which is driven by control logic and SAR circuit 38, controls switches 43, 62, and 71 and the latch inputs to comparator 36, as subsequently explained.

While a most significant group of bits (e.g., bits 1-10) of analog-to-digital converter 1 are successively tested according to well known successive approximation techniques, the voltage difference between conductors 12 and 23 ma undergo changes of from several volts to less than a millivolt. Such changes in the voltage difference between conductors 12 and 23, if larger than about a few hundred millivolts, produce MOS threshold shifts in the differential input MOSFETs of the input stage of either of amplifiers 30-1 or 32-1 if its current source (48 or 61) is connected to the common source conductor of the differential input MOSFETs.

During testing of the ten most significant bits, switch 62 connects the source electrodes of the input MOSFETs of amplifier 32-1 to current source 61. Switch 43 disconnects the source electrodes of the input MOSFETs (78A and 78B) of amplifier 30-1 from current source 48. Switch 71 connects current source 72 to the common source conductor of the MOSFET differential input stage 81A,81B of multiplexed input amplifier 35.

Since amplifier 30-1 has no channel currents flowing through its input MOSFETs 78A and 78B (FIG. 4), they experience no MOS threshold shift during testing of the ten most significant bits, because the charge trapping that causes the MOS threshold shift cannot occur without channel currents therein despite the large voltage difference between conductors 12 and 23.

However, amplifier 32-1, which has a gain G equal to 8, produces a maximum-swing differential voltage as large as about 2 volts between the inverting and non-inverting inputs of amplifier 32-2 assuming the positive power supply to be +5 volts. Amplifier 32-2, which has a gain G equal to 4, then produces a maximum-swing differential output voltage change as large as about 2 volts. The later signal is coupled by autozeroing capacitors 63A and 63B between the inverting and non-inverting inputs of amplifier 32-3, which has a gain G equal to 5. In response, amplifier 32-3 produces a maximum-swing differential output voltage as large as about 2 volts which is coupled by capacitors 64A and 64B between the lower pair of non-inverting and inverting inputs of multiplexed input amplifier 35, which has a gain equal to 4. The voltage applied between the inverting and non-inverting inputs of comparator 36 also can be a maximum-swing voltage change as large as about 2 volts during testing of the most significant bits.

Thus, sufficiently large differential voltages are likely to be applied to the inputs of each of amplifiers 32-1, 32-2, 32-2, amplifier 35, and comparator 36 to cause MOS threshold voltage shifts in each, since channel currents are present in the input MOSFET of each stage.

It can be seen that if the above-mentioned voltage changes likely to be applied between conductors 12 and 23 during testing of the ten most significant bits were to be applied between the inputs of the amplifier 30-1 with the current of current source 48 flowing in its input MOSFETs, MOS threshold shifts would be produced in all of amplifiers 30-1, 30-2, 30-3, MOSFETs 80A and 80B of multiplexed input amplifier 35. But this is avoided by opening current source switch 43. Thus, while bits 1-10 are being tested, the input stage of amplifier 30-1 is "turned off", and current source 48 is routed around differential input stage MOSFETs 78A and 78B. Since MOSFETs 78A and 78B are turned off and there is no channel current therein during the testing of bits 1–10, so the threshold voltage of MOSFETs 78A and 78B is not shifted even though the gate electrodes of MOSFETs 78A and 78B experience large differential excursions.

As indicated above, the differential input stage MOSFETs of amplifier 32-1 and also amplifiers 32-2, 32-3, and 35 do experience MOS threshold shifts, so erroneous successive approximation test decisions may be made on bits 1–10. The above-mentioned digital error correction techniques are used to correct such errors by means of circuitry contained in the control logic of block 38. In the preferred embodiment of the invention, an additional bit capacitor, which we refer to as the "bit 10A capacitor", having the same or nearly the same capacitance as bit capacitor C10 in capacitor subarray 16 of FIG. 2, is included in capacitor subarray 16. The bit 10A capacitor is tested in the same manner as the LSB capacitors for bits 11–16, with switch 43 connecting current source 48 to the source electrodes of the input MOSFETs of amplifier 30-1 so that amplifiers 30-1, 30-2, etc. amplify the voltage change on conductor 12 before applying it to the inputs of comparator 36.

An offset voltage equal to one-half the contribution of the bit 10 capacitor is applied to charge distribution conductor 12 (by switching the bit 11 capacitor from ground to reference voltage $V_R$) during the testing of MSB bits 1–10 and then that offset voltage is removed by switching the bit 11 capacitor back to ground during the testing of the LSB bits 10A and 11–16. The bit 10A capacitor is tested first. If the result is a "1" or "acceptance", this indicates that an error was made during testing of MSB bits 1–10, and the error is appropriately corrected. If the result is a "0", then no error has been made during testing of MSB bits 1–10, and the values therefore already obtained are correct.

Immediately prior to testing of the least significant group of bits including, for example, bits 11–16, the states of switches 43 and 61 are changed, and switch 71 couples current source 72 to the common source conductor of the MOS differential input stage of amplifier 35 that is connected to autozeroing capacitors 58A and 58B. Amplifiers 30-1, 30-2, 30-2, and 35 then successively amplify the voltage differences between charge distribution conductors 12 and 23 in the manner previously described. As an example, for the least significant bit (bit 16), the voltage difference between conductors 12 and 23 might be 33 microvolts, which then would be amplified by amplifiers 30-1, 30-2, and 30-3 and multiplexed input amplifier 35 to apply a voltage difference of approximately 33 millivolts between the inverting and non-inverting inputs of comparator 36.

More specifically, and referring to both FIGS. 2 and 3, the first step in the analog-to-digital conversion process is to sample $V_{IN}$, which is accomplished by operating switches 24-1, 24-2, and 24-3 to conductor 8, with switches 28A and 28B being closed so that charge distribution conductor 12 and trim CDAC conductor 23 are held at $V_{CLAMP}$.

Switches 24-4, 24-5, and 24-6 all connect the corresponding bit capacitors 20-4, 20-5, and 20-6 to ground, and similarly, all of the bit capacitors C-7 . . . C-16 in CDAC subarrays 16 and 19 also are connected to ground by their corresponding switches. For the purpose of the following discussion, it can be assumed that $V_{CLAMP}$ is equal to ground or zero volts. Then, $V_{IN}$ is stored on bit capacitors 20-1, 20-2, and 20-3. The remaining bit capacitors have zero volts across them. (Note that $V_{IN}$ could be sampled on only the most significant bit capacitor 20-1, or the first two bits, or even all of the bit capacitors.) Next, switches 28A and 28B are opened, so that charge distribution conductor 12 is electrically floating. Then the single poles of switches 24-1, 24-2, and 24-3 are connected to ground. It can be easily shown for the configuration of FIG. 2 that this causes the voltage on conductor 12 to fall to $-\frac{3}{4}V_{IN}$. (Note that if $V_{IN}$ had been sampled on all of the bit capacitors, then conductor 12 would fall to $-V_{IN}$ because there would be no capacitive voltage division due to the grounded bit capacitors for bits 4–16.)

The successive approximation testing of the 16 bit capacitors 20-1, 20-2, etc. now can be sequentially performed during 16 consecutive test intervals. During the first interval, switch 24-1 is connected to $V_R$. This increases the voltage on charge distribution conductor 12 by one-half of $V_R$. If $V_{IN}$ has a value less than its mid-scale value, charge distribution conductor 12 increases to a value below $V_{CLAMP}$, which is zero volts in this example, indicating that the "test value" of a "1" produced by SAR 38 for bit 1 (which is the MSB) should be "rejected" and the final value of bit 1 set to a "0". If $V_{IN}$ is greater than its mid-scale value, then charge distribution conductor 12 would increase to a value above the $V_{CLAMP}$ voltage of zero on conductor 12, indicating that bit 1 should be "accepted" and that bit 1 should be a "1".

During each of the 15 subsequent test intervals, the various bit capacitors C2–C16 are tested one at a time, switching them to $V_R$ and testing charge distribution conductor 12 relative to the reference voltage $V_{CLAMP}$, setting the bit corresponding to the bit capacitor being tested to a "0" and also connecting the pole of its switch 24-1, 24-2, etc. back to ground if charge distribution conductor 12 is above $V_{CLAMP}$. That bit is set equal to a "1" and the pole of its switch 24-1, 24-2, etc. is left at $V_R$ if charge distribution conductor 12 is below $V_{CLAMP}$.

At the end of each successive approximation test sequence, i.e., after bit 16 has been tested, the various autozeroing switches and switches 28A and 28B are closed so that conductors 12 and 23 are at $V_{CLAMP}$. Therefore, prior to each amplifying operation any offsets of the differential amplifiers, including any residual offsets due to MOS threshold voltage shift, are stored on the various autozeroing capacitors.

Unlike the above-described Kiriaki et al. system, comparator 36 of the present invention is not protected from MOS threshold voltage shifts during any of the successive approximation bit capacitor testing. Even when testing the least significant bit of the 16 bit analog-to-digital converter described herein, the MOS threshold voltage shift in comparator 36 is effectively divided by the combined gain of amplifiers 30-1, 30-2, 30-3, and amplifier 35 and thereby is "referred back" to the conductors 12 and 23.

More specifically, the MOS threshold shift in comparator 36 is effectively divided by the product of the gains of amplifiers 30-1, 30-2, 30-3, and amplifier 35 because the voltage change on conductor 12, when amplified by those gains, is very large (e.g., ±1 volt at the differential output of multiplexed input amplifier 35) compared to the MOS threshold shift in the differential input MOSFET stage of comparator 36, which may be only one millivolt. When this one millivolt of MOS threshold shift is "referred back" to charge distribution conductor 12, the one millivolt must be divided by the gain of amplifiers 30-1, 30-2, 30-3, and 35, which is approximately 1000.

This gives an MOS threshold shift "referred back" to the input of amplifier 30-1 of only one microvolt, which is very small compared to the LSB quantizing value of 33 microvolts on charge distribution conductor 12. (The voltage changes on charge distribution conductor 12 for bits 10A and 11-16 are approximately 2 millivolts, 1.068 millivolts, 534 microvolts, 264 microvolts, 132 microvolts, 66 microvolts, and 33 microvolts, respectively.)

The input MOSFETs of amplifier 32-1, which "see" one to two volt swings on charge distribution conductor 12 during the of the MSB capacitors (C1-C10) for bits 1-10, experience an MOS threshold shift of up to one millivolt, causing errors (which are corrected as explained above) to be made while testing the most significant bits.

Thus, the MOS threshold shift caused errors that previously limited the accuracy of a successive approximation CMOS analog-to-digital converter to approximately 11-12 bits now avoid this limitation in the present invention, even though only one comparator 36 is used and its MOSFET differential stage is not even protected from the MOS threshold voltage caused by testing of the most significant bits.

Figure 1:
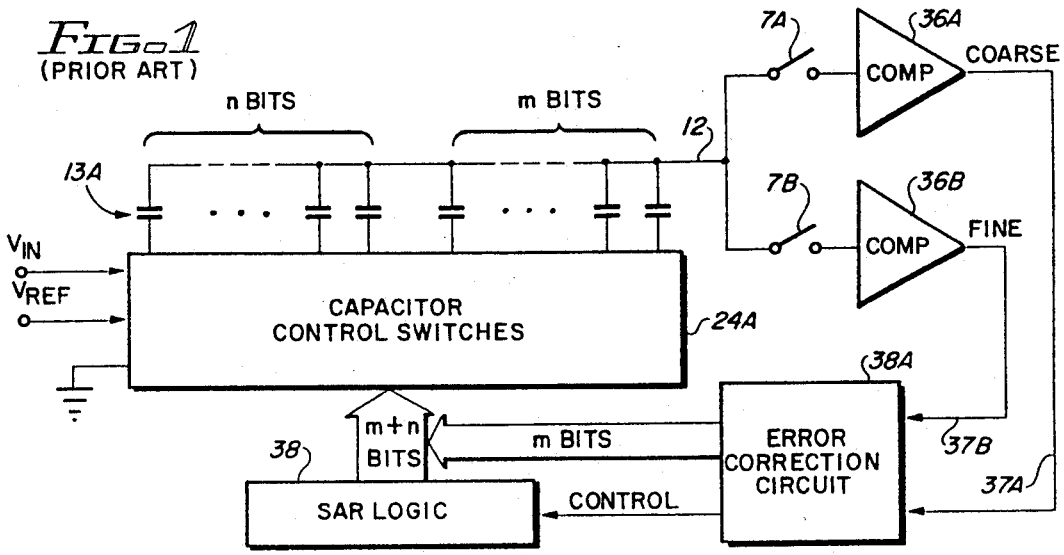
FIG. 1 is a block diagram of the prior art.

FIG. 4 shows precisely how the amplifier circuitry 30-1, 30-2, and 30-3, multiplexed input differential amplifier 35, and comparator 36 of FIG. 3 are implemented. The implementation of amplifier circuits 32-1, 32-2, and 32-3 is essentially similar but with slightly higher gains. Amplifier stage 30-1 includes source-coupled N channel MOSFETs 78A and 78B, the gate electrodes of which receive the voltage on charge distribution conductor 12 and reference voltage conductor 23. The drains of MOSFETs 78A and 78B are connected by a pair of "cascode" MOSFETs to a pair of load resistors across which the output voltage of stage 30-1 is developed. The cascode MOSFETs are biased by a reference voltage $V_{B1}$. The drain electrodes of input MOSFETs 78A and 78B are connected to the drains of another pair of source-coupled N channel MOSFETs 77A and 77B, the gate electrodes of which are biased by $V_{B2}$. SAR circuit 38 of FIG. 1 produces the signals $V_{MSB}$ and $\overline{V_{MSB}}$ on bus 40, turning on MOSFET 43A and turning off MOSFET 43B during successive approximation testing of the six least most significant bits of analog-to-digital converter 1. In this case, the current of current source 48 flows through input MOSFETs 78A and/or 78B, producing an output voltage across the load resistors. (During the previous testing of the most significant bits 1-10, MOSFET 43A is off, MOSFET 43B is on and the current supplied by current source 48 then flows equally through MOSFETs 77A and 77B, providing a suitable gate electrode bias voltage across the load resistors for the input MOSFETs of amplifier stage 30-2 )

The implementation of amplifier stage 30-2 is straightforward, as shown. The bias voltage $V_{B2}$ applied to the drain electrodes of the various P channel autozeroing transistors such as 54A and 54B, 59A and 59B, etc. is selected to provide suitable DC bias voltages for the input MOSFETs of amplifier stage 30-3, multiplexed input amplifier 35, and comparator 36.

The four input MOSFETs of multiplexed input amplifier 35 include N channel MOSFETs 80A and 80B, the gate electrodes of which are coupled by autozeroing capacitors 58A and 58B, respectively, to the outputs of amplifier 30-3. N channel MOSFETs 81A and 81B have their drains connected to the drains of MOSFETs 80A and 80B. The gate electrodes of input MOSFETs 81A and 81B are coupled by autozeroing capacitors 64A and 64B to the non-inverting and inverting outputs of amplifier 32-3. The source electrodes of input MOSFETs 80A and 80B are switched by MOSFET 71A to current source MOSFET 72, and the source electrodes of input MOSFETs 81A and 81B are connected by switching MOSFET 71B to current source 72.

During successive approximation testing of the ten most significant bits, the current supplied by current source 72 flows through input MOSFETs 81A and 81B, so the charge distribution conductor signal amplified by amplifiers 32-1, 32-2, and 32-3 (FIG. 3) is further amplified by multiplexed input amplifier 35. During successive approximation testing of least significant bits 10A and 11-16, the current supplied by current source 72 instead flows through input MOSFETs 80A and 80B, so that the voltages amplified by amplifier circuitry 30-1, 30-2, and 30-3 are amplified by multiplexed input amplifier 35. The output of multiplexed input amplifier 35 is latched into differential latch 36 when $V_{LAT}$ undergoes a transition from a "0" to a "1", producing a differential output signal that is converted to a single ended output level on conductor 37 by voltage translator circuit 36A.

It should be appreciated that current source 61 and associated switch 62 could be provided for amplifier 32-2 instead of amplifier 32-1, as indicated by dotted lines and associated numerals 61A and 62A in FIG. 2. Amplifier 32-1 would have no switch associated with its current source. This configuration has the effect of reducing the total gate electrode capacitance of the input MOSFETs of amplifier 32-1, since the input MOSFETs are in their saturated region, and their gate capacitances under these conditions are about a third less than if there is no channel current therein. It also should be appreciated that multiplexed input amplifier 35 could be replaced by four switches coupled to multiplex the output of amplifiers 30-3 and 32-3 into comparator 36, if the loss of gain and the switching transients could be accepted.

While the invention has been described with reference to several particular embodiments thereof, those skilled in the art will be able to make the various modifications to the described embodiments of the invention without departing from the true spirit and scope of the invention. It is intended that all combinations of elements and steps which perform substantially the same function in substantially the same way to achieve the same result are within the scope of the invention.

What is claimed is:

1. A method of preventing analog-to-digital conversion errors due to MOS threshold shifts produced in a comparator during successive approximation testing of MSB and LSB groups of binarily weighted bit capacitors, comprising the steps of:
    (a) subjecting a MOSFET in an input stage of the comparator to sufficiently large input voltages representative of voltage changes produced on a charge distribution conductor connected to the bit capacitors during successive approximation testing of the bit capacitors of the MSB group to cause an MOS threshold shift to occur in the MOSFET; and
    (b) amplifying signals representative of voltage changes produced on the charge distribution conductor during successive approximation testing of bit capacitors of the LSB group by means of an amplifier and applying the signals to the MOSFET, the amplified signals being amplified by a sufficiently large gain that the MOS threshold shift, when referred back to an input of the amplifier by dividing the MOS threshold shift by the gain, is small enough compared to the voltage changes produced on the charge distribution conductor during the successive approximation testing of the bit capacitors of the LSB group to avoid conversion errors.

2. A method of preventing analog-to-digital conversion errors due to MOS threshold shifts produced in a comparator during successive approximation testing of MSB and LSB groups of binarily weighted bit capacitors, comprising the steps of:
  (a) subjecting a pair of MOSFETs in an input stage of the comparator to sufficiently large differential input voltages representative of voltage changes produced on a charge distribution conductor connected to the bit capacitors during successive approximation testing of the bit capacitors of the MSB group to cause an MOS threshold shift to occur in one of the MOSFETs; and
  (b) amplifying signals representative of voltage changes produced on the charge distribution conductor during successive approximation testing of bit capacitors of the LSB group by means of an amplifier and applying the signals between the MOSFETs, the amplified signals being amplified by a sufficiently large gain that the MOS threshold shift, when referred back to an input of the amplifier by dividing the MOS threshold shift by the gain, is small enough compared to the voltage changes produced on the charge distribution conductor during the successive approximation testing of the bit capacitors of the LSB group to avoid conversion errors.

3. A circuit for preventing analog-to-digital conversion errors due to MOS threshold shifts produced in a comparator during successive approximation testing of MSB and LSB groups of binarily weighted bit capacitors, comprising in combination:
  (a) a first differential amplifier that amplifies voltage changes produced on a charge distribution conductor connected to the bit capacitors during successive approximation testing of the bit capacitors of the MSB group, the first differential amplifier subjecting first and second MOSFETs in an input stage of the comparator to sufficiently large differential input voltages to cause an MOS threshold shift to occur in at least one of the first and second MOSFETs during such successive approximation testing of the bit capacitors of the MSB group;
  (b) a second differential amplifier amplifying signals representative of voltage changes produced on the charge distribution conductor during successive approximation testing of bit capacitors of the LSB group;
  (c) first means for selectively applying the amplified signals between the first and second MOSFETs during the successive approximation testing of bit capacitors of the LSB group, the second differential amplifier having a sufficiently large gain that the MOS threshold shift, when referred back to an input of the second amplifier by dividing the MOS threshold shift by the gain, is small enough compared to the voltage changes produced on the charge distribution conductor during the successive approximation testing of the bit capacitors of the LSB group to avoid conversion errors.

4. A circuit for preventing analog-to-digital conversion errors due to MOS threshold shifts produced in a comparator during successive approximation testing of MSB and LSB groups of binarily weighted bit capacitors, comprising in combination:
  (a) a first amplifier that amplifies voltage changes produced on a charge distribution conductor connected to the bit capacitors during successive approximation testing of the bit capacitors of the MSB group, the first amplifier subjecting a first MOSFET in an input stage of the comparator to sufficiently large input voltages to cause an MOS threshold shift to occur in the first MOSFET during such successive approximation testing of the bit capacitors of the MSB group;
  (b) a second amplifier amplifying signals representative of voltage changes produced on the charge distribution conductor during successive approximation testing of bit capacitors of the LSB group;
  (c) first means for selectively applying the amplified signals to the first MOSFET during the successive approximation testing of bit capacitors of the LSB group, the second amplifier having a sufficiently large gain that the MOS threshold shift, when referred back to an input of the second amplifier by dividing the MOS threshold shift by the gain, is small enough compared to the voltage changes produced on the charge distribution conductor during the successive approximation testing of the bit capacitors of the LSB group to avoid conversion errors.

5. The circuit of claim 4 including second means for selectively applying signals amplified by the first amplifier to the first MOSFET during the successive approximation testing of the bit capacitors of the MSB group.

6. The circuit of claim 5 wherein the input stage of the comparator is a differential input stage that includes the first MOSFET and a second MOSFET having its source electrode connected to the source electrode of the first MOSFET, the gate electrodes of the first and second MOSFETs being coupled to first and second outputs of the first amplifier by the second means and to first and second outputs of the second amplifier by the first means.

7. The circuit of claim 6 wherein the first amplifier includes an input stage including source-coupled third and fourth MOSFETs having gate electrodes coupled to the charge distribution conductor and a reference conductor, respectively, and first switching means for selectively coupling a first current source to the source electrodes of the third and fourth MOSFETs during the successive approximation testing of the bit capacitors of the MSB group, and
  wherein the second amplifier includes an input stage including fifth and sixth source-coupled MOSFETs having gate electrodes coupled to the charge distribution conductor, and a reference conductor respectively, and second switching means for selectively coupling a second current source to the source electrodes of the fifth and sixth MOSFETs during the successive approximation testing of the bit capacitors of the LSB group.

8. The circuit of claim 7 wherein the first and second means are included in a multiplexed input amplifier coupling the first and second outputs of both the first and second amplifiers to the gate electrodes of the first and second MOSFETs, respectively.

9. The circuit of claim 8 wherein the comparator includes the differential input stage and a latch stage having differential inputs coupled to outputs of the differential input stage.

10. The circuit of claim 8 wherein the total gain through the first amplifier multiplexed input amplifier is approximately 1000.

11. The circuit of claim 10 wherein the total gain through the first amplifier multiplexed input amplifier is approximately 700.

12. The circuit of claim 4 including means coupled to an output of the comparator for correcting errors in the successive approximation testing of a bit capacitor of the MSB group.

13. In an analog-to-digital converter including an MSB group of binarily weighted capacitors and an LSB group of binarily weighted capacitors each coupled to a charge distribution conductor, circuitry comprising in combination:
  (a) a first amplifier circuit including a first MOSFET input circuit coupled to the charge distribution conductor;
  (b) first means for selectively coupling a first current source to the first MOSFET input circuit during testing of capacitors of the MSB group;
  (c) a second amplifier circuit including a second MOSFET input circuit coupled to the charge distribution conductor;
  (d) third means for selectively coupling a second current source to the second MOSFET input circuit during the testing of capacitors of the LSB group;
  (e) a comparator including a third MOSFET input circuit;
  (f) third means for selectively coupling an output of the first amplifier to the third MOSFET input circuit during the testing of the capacitors of the MSB group, producing an MOS threshold shift in the third MOSFET input circuit, and selectively coupling an output of the second amplifier to the third MOSFET input circuit during the testing of the capacitors of the LSB group, the third MOSFET input circuit storing the MOS threshold shift during the testing of the capacitors of the LSB group; and
  (g) means responsive to the comparator for controlling the testing of the capacitors.

14. A method of testing bit capacitors of an array including an MSB group of binarily weighted capacitors and an LSB group of binarily weighted capacitors in an analog-to-digital converter, comprising the steps of:
  (a) sampling an analog input voltage on a first bit capacitor;
  (b) causing a first bias current to flow through an input MOSFET of a first amplifier and preventing a second bias current from flowing through an input MOSFET of a second amplifier;
  (c) testing a bit capacitor of the MSB group by means of a successive approximation circuit to produce a first voltage change on a charge distribution conductor coupled to the capacitors;
  (d) applying the first voltage change to the input MOSFET of the first amplifier, producing an MOS threshold shift therein, and to the input MOSFET of the second amplifier, producing no MOS threshold shift therein;
  (e) coupling a first output signal produced by the first amplifier to an input MOSFET of a comparator, causing an MOS threshold shift therein and producing a first comparator output signal to control the successive approximation circuit;
  (f) causing a second bias current to flow through the input MOSFET of the second amplifier;
  (g) testing a bit capacitor of the LSB group in response to the successive approximation circuit to produce a second voltage change on the charge distribution conductor;
  (h) applying the second voltage change to the input MOSFET of the first amplifier and to the input MOSFET of the second amplifier; and
  (i) coupling a second output signal produced by the second amplifier to the input MOSFET of the comparator, and producing a second comparator output signal to control the successive approximation circuit.

15. A method of preventing analog-to-digital conversion errors due to MOS threshold shifts produced in a comparator during successive approximation testing of MSB and LSB groups of binarily weighted bit capacitors, comprising the steps of:
  (a) causing a first bias current to flow through an input MOSFET of a first amplifier and preventing a second bias current from flowing through an input MOSFET of a second amplifier;
  (b) applying voltage changes produced on a charge distribution conductor coupled to the bit capacitors during successive approximation testing of bit capacitors of the MSB group to the input MOSFET of the first amplifier, producing an MOS threshold shift therein, and to the input MOSFET of the second amplifier, producing no MOS threshold shift therein;
  (c) coupling a first output signal produced by the first amplifier to an input MOSFET of the comparator, causing an MOS threshold shift therein and causing the comparator to produce a first comparator output signal to control a successive approximation circuit;
  (d) causing the second bias current to flow through the input MOSFET of the second amplifier;
  (e) applying voltage changes produced on the charge distribution conductor during successive approximation testing of bit capacitors of the LSB group to the input MOSFET of the first amplifier, and to the input MOSFET of the second amplifier; and
  (f) coupling a second output signal produced by the second amplifier to the input MOSFET of the comparator, causing an MOS threshold shift therein and causing the comparator to produce a second comparator output signal to control the successive approximation circuit.

16. In an MOS analog-to-digital converter, successive approximation circuitry comprising in combination:
  (a) an array of binarily weighted capacitors, including a most significant group thereof and a least significant group thereof, each coupled to a charge distribution conductor, at least one of the binarily weighted capacitors being coupled by a sampling switch to receive an analog input voltage, the other binarily weighted capacitors being switchable between first and second reference voltages in response to test bit signals produced by a successive approximation control circuit;

(b) a first amplifier circuit including a first differential MOSFET input circuit and first and second inputs coupled thereto and to the charge distribution conductor and a reference signal conductor, respectively, a first current source and a first switch selectively coupling the first current source to a common source conductor of the first differential MOSFET input circuit during the testing of capacitors of the most significant group in response to a first test bit signal;

(c) a second amplifier circuit including a second differential MOSFET input circuit and first and second inputs coupled thereto and to the charge distribution conductor and a reference signal conductor, respectively, a second current source and a second switch selectively coupling the second current source to a common source conductor of the second differential MOSFET input circuit during the testing of capacitors of the least significant group in response to a second test bit signal;

(d) a multiplexed input differential amplifier including a third differential MOSFET input circuit and first and second inputs coupled thereto and to first and second outputs of the first amplifier circuit, respectively, a fourth differential MOSFET input circuit and third and fourth inputs coupled thereto, and to first and second outputs of the second amplifier circuit, respectively, a third current source and a third spot switch selectively coupling the third current source to a common source conductor of the third differential input circuit during the testing of capacitors of the most significant group, and the third switch selectively coupling the third current source to a common source conductor of the fourth differential MOSFET input circuit during the testing of capacitors of the least significant group; and (e) a comparator including a fifth differential MOSFET input circuit having inputs coupled to first and second outputs, respectively, of each of the first and second amplifier circuits, the comparator including an output circuit coupled to the successive approximation control circuit to control the logic levels of the test bit signals.

* * * * *